United States Patent
Chi et al.

(10) Patent No.: US 8,836,141 B2
(45) Date of Patent: *Sep. 16, 2014

(54) CONDUCTOR LAYOUT TECHNIQUE TO REDUCE STRESS-INDUCED VOID FORMATIONS

(71) Applicant: Taiwan Semiconductor Manufacturing Co., Ltd., Hsin-Chu (TW)

(72) Inventors: Min-Hwa Chi, Hsin-Chu (TW); Tai-Chun Huang, Hsin-Chu (TW); Chih-Hsiang Yao, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/869,844

(22) Filed: Apr. 24, 2013

(65) Prior Publication Data

US 2013/0241079 A1    Sep. 19, 2013

Related U.S. Application Data

(63) Continuation of application No. 11/438,127, filed on May 22, 2006, now Pat. No. 8,435,802.

(51) Int. Cl.
   *H01L 23/48*   (2006.01)
   *H01L 23/52*   (2006.01)

(52) U.S. Cl.
   USPC .......... 257/774; 257/773; 257/609; 257/610; 257/611; 257/612; 438/5; 438/622; 438/638; 438/624; 438/618

(58) Field of Classification Search
   USPC .............. 257/773, 774; 438/5, 622, 638, 637, 438/624, 618
   See application file for complete search history.

(56) References Cited

U.S. PATENT DOCUMENTS

| | | | |
|---|---|---|---|
| 2,175,036 A * | 10/1939 | Sipe | 174/84 S |
| 5,317,185 A | 5/1994 | Fernandes et al. | |
| 5,686,356 A * | 11/1997 | Jain et al. | 438/624 |
| 5,814,557 A | 9/1998 | Venkatraman et al. | |
| 6,081,031 A | 6/2000 | Letterman, Jr. et al. | |
| 6,081,036 A * | 6/2000 | Hirano et al. | 257/773 |
| 6,670,216 B2 * | 12/2003 | Strauch | 438/106 |
| 6,917,116 B2 * | 7/2005 | Kordic et al. | 257/774 |

(Continued)

FOREIGN PATENT DOCUMENTS

NP    2087 A    10/1999

*Primary Examiner* — Fernando L Toledo
*Assistant Examiner* — Mohammed Shamsuzzaman
(74) *Attorney, Agent, or Firm* — Duane Morris LLP

(57) ABSTRACT

A semiconductor device is prepared by an annealing process to interconnect at least two components of the device by a conductor line surrounded by an insulator material. The annealing process results in formation of residual stresses within the conductor line and the insulator material. A notch is designed in the layout on a selective portion of the mask for patterning conductor line. The existence of a shape of notch on the selective portion generates extra stress components within the conductor line than if without the existence of the notch. The position of the notch is selected so that the extra stress components substantially counteract the residual stresses, thereby causing a net reduction in the residual stresses. The reduction in the residual stresses results in a corresponding mechanical stress migration and therefore improvement in the reliability of the device.

13 Claims, 15 Drawing Sheets

(56) References Cited

U.S. PATENT DOCUMENTS

| | | |
|---|---|---|
| 7,033,924 B2 | 4/2006 | Ogawa et al. |
| 2002/0192886 A1 | 12/2002 | Inoue |
| 2003/0122260 A1 | 7/2003 | Ogawa et al. |
| 2004/0041274 A1 | 3/2004 | Ogawa et al. |
| 2004/0140565 A1 | 7/2004 | Kordic et al. |
| 2005/0095845 A1 | 5/2005 | Kawano |
| 2005/0107870 A1 | 5/2005 | Wang et al. |
| 2005/0186782 A1* | 8/2005 | Burke et al. ............ 438/638 |
| 2005/0260850 A1 | 11/2005 | Loke et al. |
| 2007/0018299 A1 | 1/2007 | Koo et al. |
| 2007/0259518 A1* | 11/2007 | Allman et al. ............ 438/622 |
| 2010/0155862 A1 | 6/2010 | Shiraishi et al. |
| 2010/0258309 A1 | 10/2010 | Ayodele et al. |
| 2010/0330798 A1 | 12/2010 | Huang et al. |

* cited by examiner

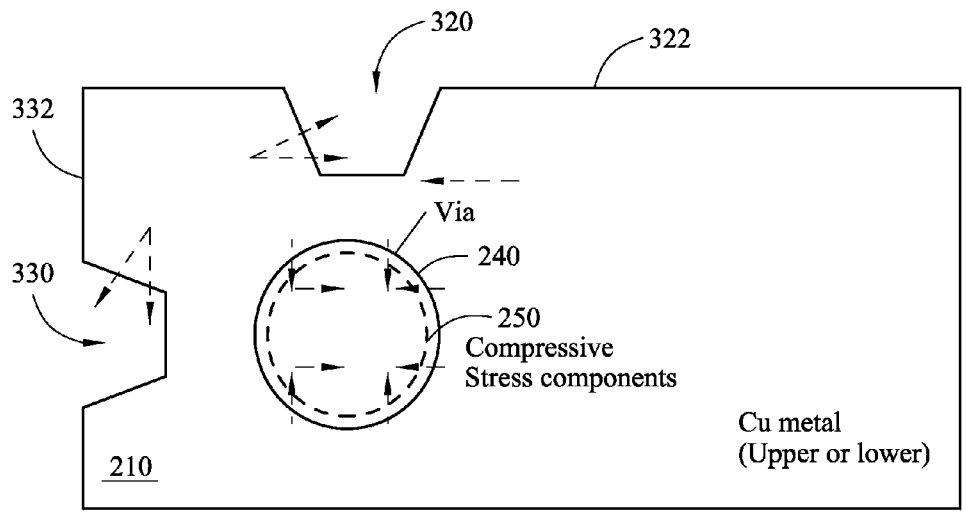
FIG. 3A1
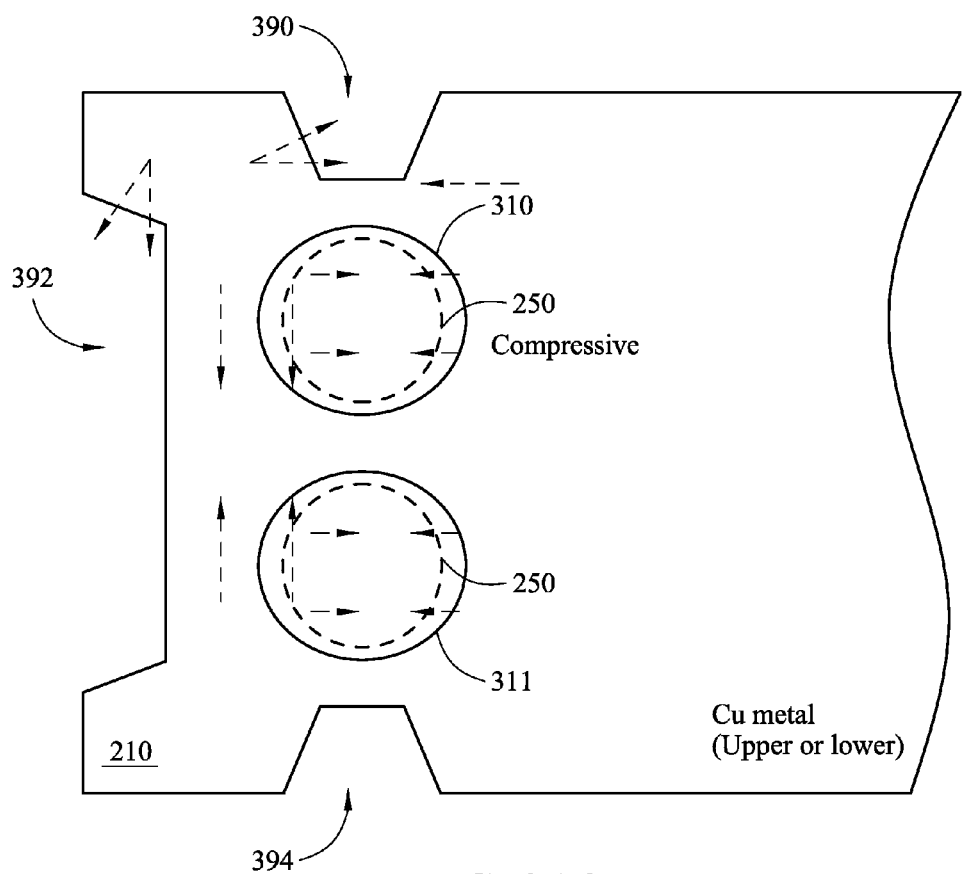
FIG. 3A2

CONDUCTOR LAYOUT TECHNIQUE TO REDUCE STRESS-INDUCED VOID FORMATIONS

RELATED APPLICATIONS

This application is a continuation of U.S. patent application Ser. No. 11/438,127, filed on May 22, 2006, set to issue as U.S. Pat. No. 8,435,802 on May 7, 2013, the contents of which are hereby incorporated by reference as if set forth in their entirety.

BACKGROUND

The present invention relates generally to semiconductor integrated circuits, and, more particularly, to a method and apparatus for reducing void formation induced failures caused as a result of stress-migration characteristics of conductors in integrated circuits.

Since the introduction of integrated circuit (IC) devices, there has been a continuous drive to improve their quality, reliability and cost/unit. This drive has been fueled by consumer demand for improved computers and electronic devices, which are more reliable, cost less, occupy less space and use less power.

In a semiconductor fabrication process, IC's are fabricated by sequentially forming features in layers of material in a bottom-up manufacturing method. The manufacturing process utilizes a wide variety of processing and measuring tools and techniques to form various layered features.

Reliability is a significant factor in IC design, production and operation. Process parameters are tightly controlled to ensure high reliability during all stages of manufacturing process. Where feasible, samples are taken and tests are performed at many intermediate stages of the process so corrective action may be taken if found to be necessary. The importance of precise control of process parameters such as thickness, dopant concentration, gate length and temperatures will be appreciated when it is realized that IC manufacturing typically requires precise execution of hundreds of steps. Completion of all steps for each wafer may typically require several days or even weeks. An improvement in the reliability of the circuit design itself and in the manufacturing process is important to avoid a significant economic loss of wafers themselves and in lost opportunity to meet customer demand. Various factors affecting reliability of a semiconductor device are described in FIGS. 1A through 1D below.

FIGS. 1A, 1B, 1C and 1D are illustrative diagrams of interconnect structure between two adjacent layers of interconnection in a state-of-art IC with multiple layers of interconnection not shown) according to prior art. FIGS. 1A and 1C are views in perspective illustrating the interconnect structure and FIGS. 1B and 1D are cross sectional views of the interconnect structure. Referring to FIGS. 1A and 1B, conductors 110, 115, and 120 are connected through vias 130 and 140 or through holes. The lower metal line 115 is narrower compared to the other metal lines 110 and 120. Hence, if there is a current flowing from metal 120 through via 140, metal line 115, via 130, and metal 110 as shown in FIG. 1A with the electron current flowing in the opposite direction of current flow, the narrower metal line 115 carries a higher current density than metal lines 110 and 120. A low k dielectric 190 is used as insulator. Similarly, in FIGS. 1C and 1D, conductors 110, 117, and 120 are connected through vias 130 and 140. The upper metal line 117 is narrower compared to the other metal lines 110 and 120. The low k dielectric 190 is used as insulator. The conducting materials of metal lines and vias typically used in CMOS technology include aluminum, aluminum alloys, refractory metal, copper, copper alloys, gold, gold alloys, silver, silver alloys, and the like, and doped polysilicon and silicides.

Typical examples of various components interconnected by metal lines and vias within an IC include transistors, diodes, resistors, capacitors, contact terminals and the like. Advances in sub-micron CMOS technology generally requires that the interconnect density be enhanced by decreasing the metal pitch and via size as well as increasing the number of interconnect metal layers. Therefore, as the dimensions of the active devices decreases and interconnect density increases, there is typically higher current density flowing in metal lines and vias. The increased time constant and reduced reliability of multi-level interconnection are considered major possible limitations to the circuit performance.

One factor affecting reliability of IC is the mechanical stress migration of metal lines and vias. As is well known, the mechanical stress migration is the movement of atoms of the conducting material from which the conductor is fabricated as a result of residual stress caused by the mismatch of thermal expansion coefficients between the metal and surrounding dielectric materials. The residual stress is typically tensile as the thermal expansion coefficients of usual conduction materials are typically larger than that of the surrounding insulator. The magnitude of tensile stress in metal lines is bi-axial and larger with wider dimension. Further, the mechanical stress migration occurs most significantly at elevated temperatures (e.g. ~100-200° C.). At such temperature range, the atomic movement in metal line is more significant due to atoms energetic enough under large enough mechanical stress. There is no significant atomic movement either at too high a temperature e.g. >300° C. (due to much reduced residual mechanical stress in metal line) or at room temperature due to not enough energy of atoms.

Another factor affecting reliability of IC is the electromigration, which is known as the migration of metal atoms e.g. copper atoms in a conductor along the direction of electron flow (or to the opposite direction of electrical current flow as defined conventionally. The migration of metal atoms will occur more significantly on locations where there is larger electron current density e.g. locations of metal line near corners, inside vias near bottom and locations at elevated temperatures e.g. due to local excessive thermal generation by current paths. Both the mechanical stress migration and electro-migration results in damage in terms of void formations and formation of hillock growths or accumulations that enlarge over time. These voids will eventually leads to circuit failures by open or high resistive metal lines or vias. These hillocks will eventually leads to circuit failures by shorts or lower breakdown voltage in between metal layers. Even when there are no substantial mechanical stresses present, electro-migration may still occur provided there is a large enough current density flowing at high enough operating temperature e.g. 80-150° C. Similarly, even when there is no current flow, mechanical stress migration can also occur provided there is large enough mechanical stress at high enough operation temperature. Thus, the mechanical stress migration and electro-migration are two independent failure mechanisms of multi-level inter-connection in modern VLSI; however, these two mechanisms may work collectively together for accelerating void formation, or they may influence each other for suppressing the net atomic migration depending on the electron flow direction. Some techniques for minimizing mechanical stress migration may also reduce electro-migration and improve reliability of multi-level inter-connection in VLSI.

Referring to FIG. 1B, voids or void formation 160 may be formed adjacent to via bottom below the barrier metal of via on the cathode side 132 e.g., via 130 bottom by electromigration of copper atoms along electron flow 150, and copper accumulation occurs at the anode side 142 e.g., via 140. The mechanism of void formation by electro-migration is thus related to the movement of copper atoms away from the via bottom 132 along the direction of electron flow 150 or alternatively copper vacancies moving towards the via bottom along the direction of current flow.

As described earlier, voids may also be formed due to mechanical stress migration, when there is no current flowing through metal lines and vias (i.e. there is no electro-migration in this case). In a via structure with wide upper metal, similar to FIG. 1B, void may be formed above the barrier metal near via 130 or 140 bottom not shown in FIG. 1B as a result of larger tensile stress in the wider metal lines 110 and 120 than the stress in narrower metal line 115 and the inside of vias 130 and 140. Thus, there is a net mechanical stress encouraging Cu atoms movement toward the upper wide metal line 110 and 120 with void formed above the via bottom. Note that the barrier metal between the metal line 115 and the bottom of via 130, 140 prevents those Cu atoms moving toward the upper wide metal line 110 through the barrier from the narrow metal line 115; as a result, the void by mechanical stress migration in this structure is typically formed above the barrier near via bottom. Certainly, as described earlier, both mechanical stress migration as well as electro-migration can result in formation of voids in a collective manner.

Now referring to FIG. 1D, the narrower upper metal line 117 carries higher current density than the wider metal line 110, 120 and it is similar to metal line 115. Voids 160 are formed in via 130 bottom above the barrier metal and copper line corner at cathode side 132 along the direction of electron flow by electro-migration mechanism. In the via structure with wide lower metal, similar to FIG. 1B, stress induced voids may be formed below barrier metal near via 130 as a result of mechanical stress migration by the larger magnitude of tensile stress in wider metal line 110 or 120.

As described earlier, void formation, such as the formation of void 160, is generally associated with tensile stresses in metal line. However, those atoms moving from voids will finally accumulate elsewhere nearby and form hillocks. The local area near hillocks in metal line generally has less tensile stress or even compressive stresses. The void formations result in an increased resistance and may eventually cause an open circuit failure in the interconnect. The accumulation (or hillocks) results in fracturing the surrounding passivation layers and may produce short circuits between neighboring interconnects. Obviously, both void formation and accumulation negatively impacts chip reliability.

The IC interconnects have been traditionally made from aluminum and its alloys. However, in recent years, the use of copper and copper alloys in combination with materials of lower dielectric constant as insulators has increased due to lower resistance (compared to aluminum) and reduced capacitance values for the interconnects. However, because copper is not easily etched it requires new processing methods, notably the damascene process with chemical-mechanical polishing (CMP).

The following technical publications describe various aspects of reducing mechanical stress induced voiding [1-3] and electro-migration induced voiding [4-5] in copper interconnects to improve reliability and are incorporated herein by reference:

a. K. Y. Y. Doong, and et al., stress induced voiding and its geometry dependency characterization. IEEE international Reliability Physics Symposium, p. 138, 2003.
b. I. Oshima, et al., Suppression of stress-induce voiding in Copper interconnects, Technical Digest of IEDM, p. 757, 2003.
c. E. I. Ogawa, et al., Stress induced voiding under vias connected to wide Cu metal leads. IEEE international Reliability Physics Symposium, p. 312-321, 2002.

Presently, traditional techniques to reduce mechanical stress migration rely on adding extra process steps in the fabrication process. For example, those well-known techniques for reducing void formation include improving via shape, via cleaning, barrier metal adhesion improvement, increasing copper grain size by annealing, and implementing dual vias to wide metal lines. However, virtually all of these techniques also require adding extra steps to the manufacturing process, thereby adding extra costs, complexity and time delays.

Thus, a need exists to provide an improved technique to reduce the migration of metal atoms in integrated circuits to improve reliability. In addition, a need exists to provide the technique to reduce mechanical stress migration preferably without having to add extra steps to the manufacturing process.

SUMMARY OF THE INVENTION

The problems outlined above are addressed in a large part by an apparatus and method for reducing failures caused by the migration of metal atoms in integrated circuits, as described herein. According to one form of the invention, a semiconductor device is prepared by an annealing process to interconnect at least two components of the device by a conductor line surrounded by an insulator material. The annealing process results in formation of residual mechanical stresses, which are typically tensile or compressive within the conductor line and the insulator material respectively. A notch is formed on a selective portion of the conductor line. The formation of the notch on the selective portion generates extra stress components within the conductor line. The position of the notch is selected so that the extra stress components substantially counteract the residual mechanical stresses, thereby causing a net reduction in the residual mechanical stresses to suppress the movement of metal atoms. The reduction in the residual stresses and suppression of movement of metal atoms results in a corresponding improvement in the reliability of the device.

According to another aspect of the invention, the method for reducing failures in a semiconductor circuit caused by residual mechanical stress includes placing a notch shape in a layout of a selective portion of a metal line mask for patterning a plurality of conductor lines included in the circuit. A portion of a semiconductor circuit is fabricated to include a conductor line surrounded by an insulator material. The conductor line electrically interconnects at least two components of the circuit. The fabrication of the portion of the semiconductor circuit results in formation of residual mechanical stresses within the conductor line and the insulator material due to a mismatch between coefficients of thermal expansion of the conductor line and the insulator. The circuit is generally prepared by an annealing process, which produces thermal stresses as a result of the mismatch between coefficients of thermal expansion and the thermal stresses generate the residual stresses. One or more notches are designed on a selective portion of the conductor line. The formation or positioning of the notch on the selective portion generates extra stress components within the conductor line. The extra stress components generated by the notch substantially counteract the residual stresses to suppress movement of metal atoms. This reduces the movement of metal atoms thereby causing the reduction of mechanical stress induced voids within the semiconductor circuit.

Several advantages are achieved by the method and system according to the illustrative embodiments described herein. The embodiments advantageously provide for a system and method for reducing failures in a semiconductor circuit caused by migration of metal atoms. The extra stress components generated by the notching technique advantageously reduce the mechanical residual stress and improve reliability without having to add extra steps to the manufacturing process thereby avoiding addition of extra costs, complexity and time delays.

Other forms, as well as objects and advantages of the invention will become apparent upon reading the following detailed description and upon reference to the accompanying drawings.

BRIEF DESCRIPTION OF THE DRAWING

Novel features believed characteristic of the invention are set forth in the appended claims. The invention itself, however, as well as a preferred mode of use, various objectives and advantages thereof, will best be understood by reference to the following detailed description of an illustrative embodiment when read in conjunction with the accompanying drawings. Elements, which appear in more than one figure herein, are numbered alike in the various figures.

FIGS. 3A1 and 3A2 are illustrative schematic diagrams for optimally positioning one or more notches of FIGS. 2A-2H to reduce mechanical stress induced voiding (SIV) in metal interconnects, according to an embodiment.

DETAILED DESCRIPTION

Figure 1A:
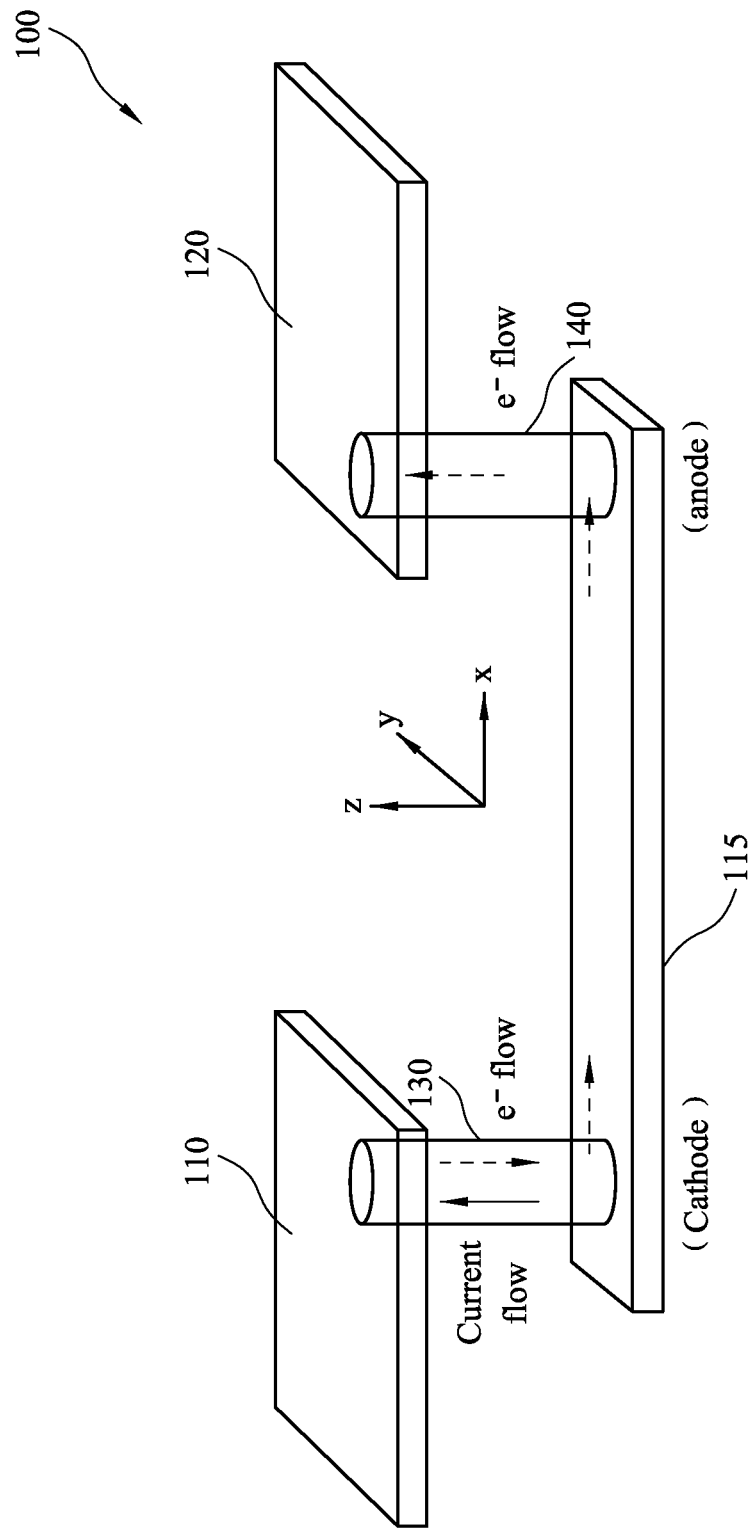
FIGS. 1A, 1B, 1C and 1D are illustrative diagrams of an interconnect structure of IC with multi-level of interconnection, described herein above, according to prior art.
Figure 1B:
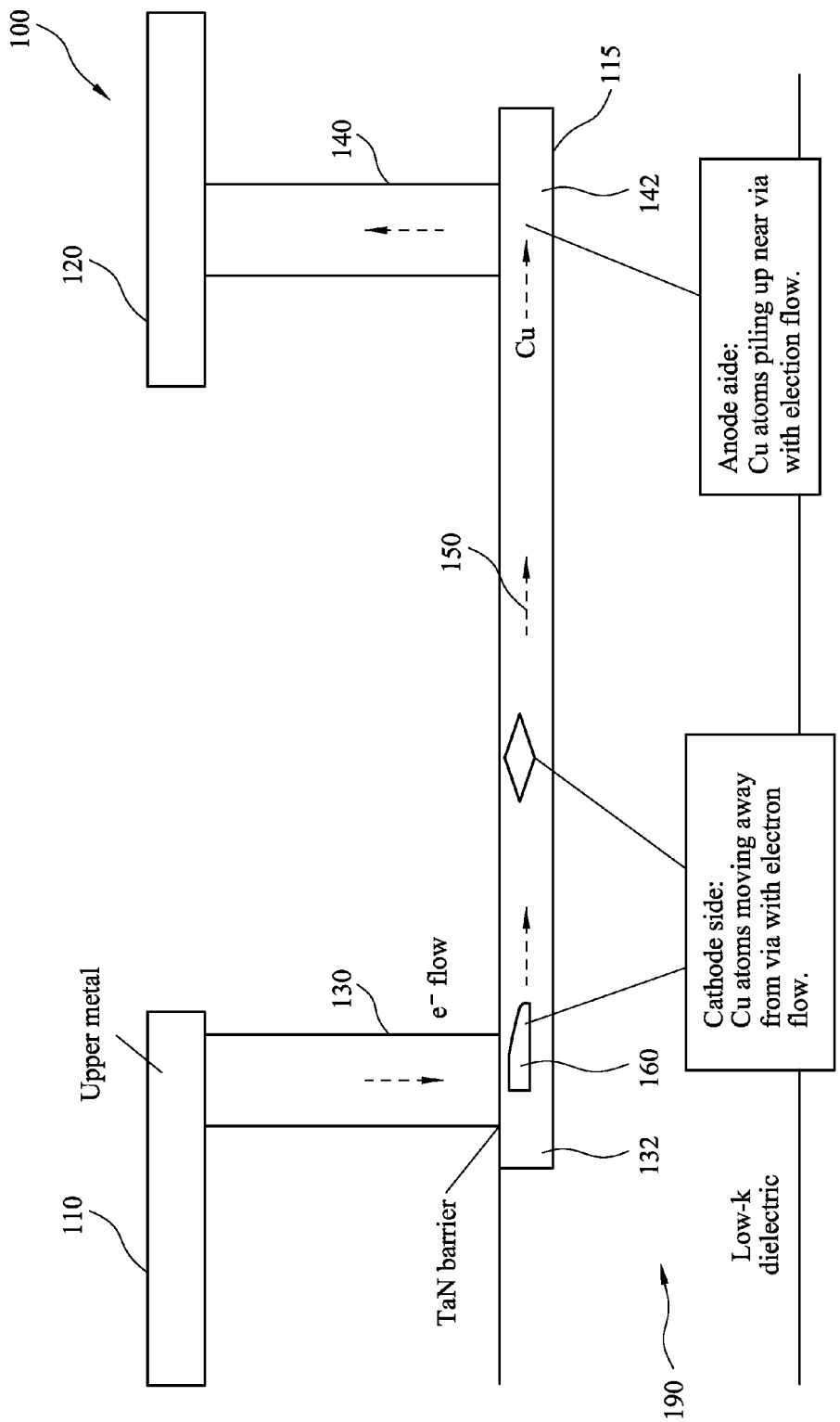
Figure 1C:
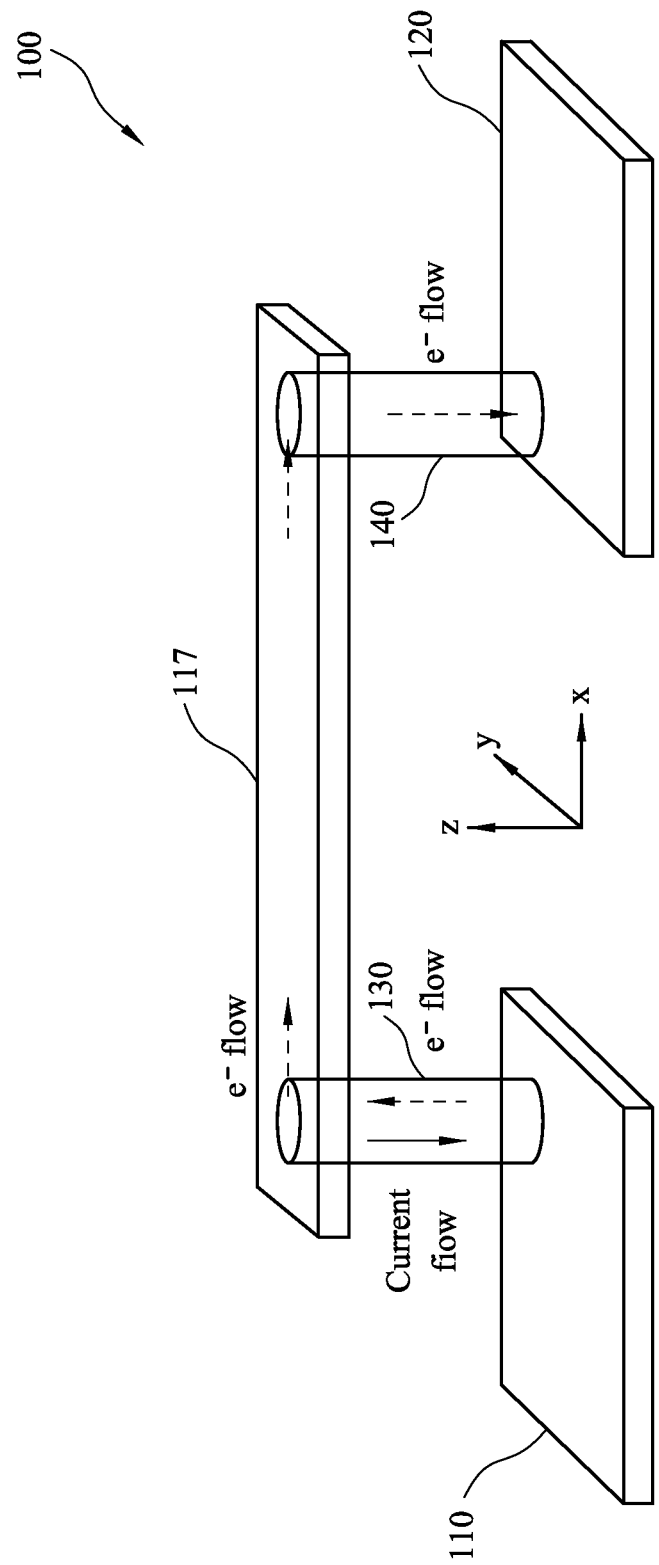
Figure 1D:
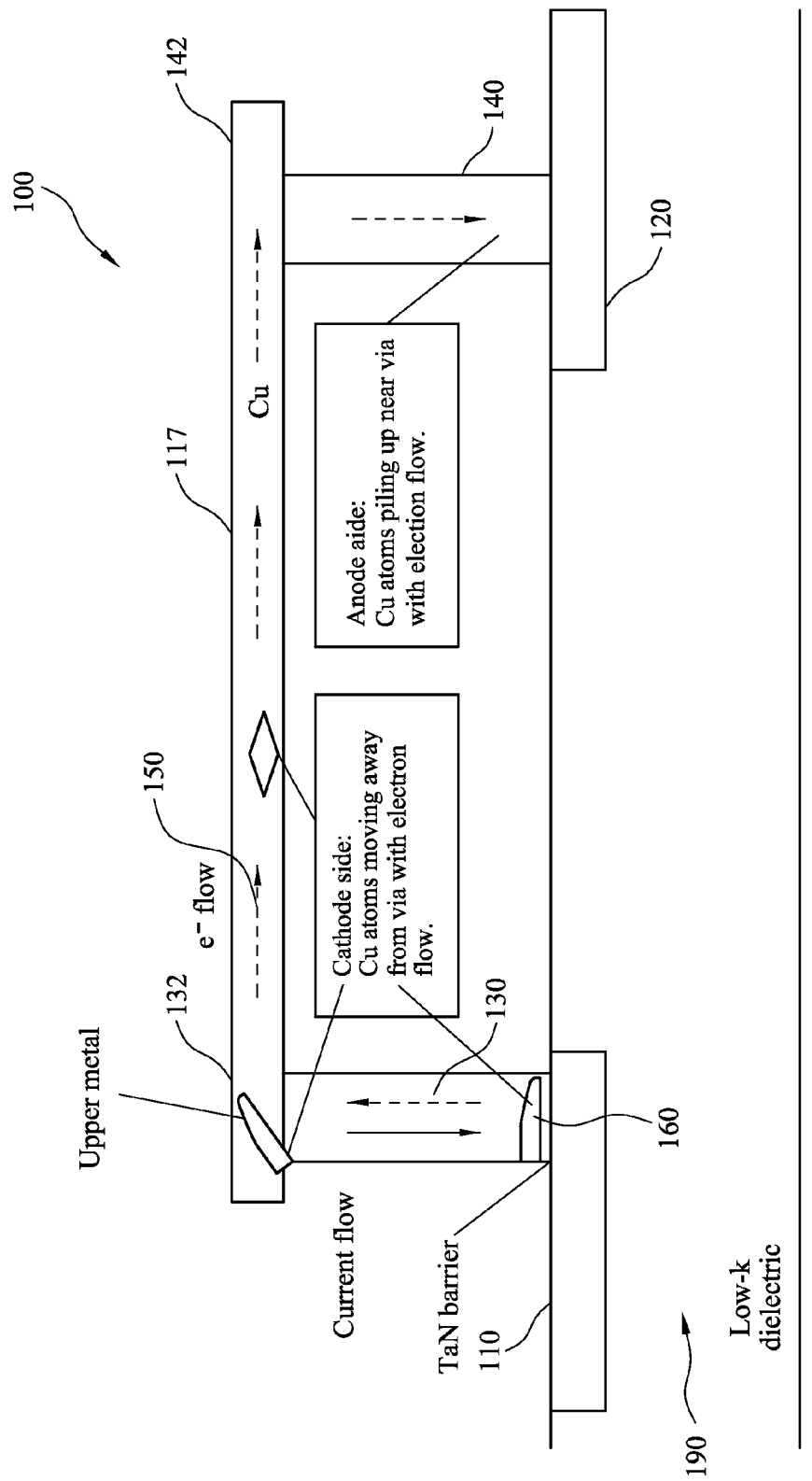

While the invention is susceptible to various modifications and alternative forms, specific embodiments thereof are shown by way of example in the drawings and will be described herein in detail. It should be understood, however, that the drawings and detailed description thereto are not intended to limit the invention to the particular form disclosed, but on the contrary, the intention is to cover all modifications, equivalents and alternatives tailing within the spirit and scope of the present invention as defined by the appended claims.

Traditional mechanical stress induced void reduction techniques used in semiconductor devices made from copper and low dielectric insulator have relied on adding extra steps to the manufacturing process. Hence, virtually all of these techniques also add extra costs, complexity and time delays. The present invention describes an apparatus and method for an improved semiconductor device having reduced stress induced void formations. According to one form of the invention, a semiconductor device is prepared by an annealing process to interconnect at least two components of the device by a conductor line surrounded by an insulator material. The annealing process results in formation of residual mechanical stresses, which may be tensile or compressive within the conductor line and the insulator material. A notch is formed on a selective portion of the conductor line. The formation of the notch on the selective portion generates extra stress components within the conductor line. The position of the notch is selected so that the extra stress components substantially counteract the residual mechanical stresses, thereby causing a net reduction in the residual stresses. The net reduction in residual mechanical stresses reduces movement of metal atoms. The reduction in the residual mechanical stresses and suppression of movement of metal atoms results in a corresponding improvement in the reliability of the device.

Figure 2A:
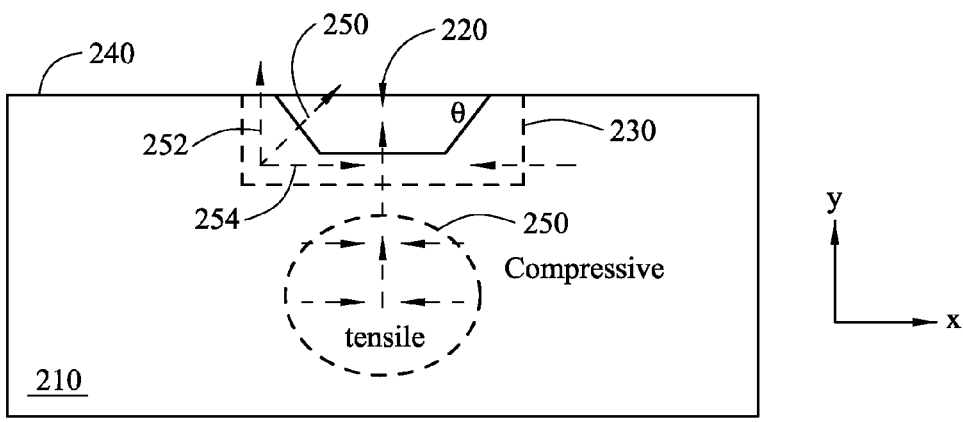
FIG. 2A is an illustrative schematic diagram for generating extra mechanical stress components in a conductor line, according to an embodiment.

FIG. 2A is an illustrative schematic diagram for generating extra mechanical stress components in a conductor line, according to an embodiment. A conductor line 210 extending in an X-Y direction (or alternatively the top view) is shown. In one embodiment, the conductor line 210 is fabricated from a metal such as copper or an alloy of copper. In one embodiment, the conductor line 210 includes one of metal lines 110, 115, 117 and 120. A notch 220 is intentionally formed on a selective portion 230 of the conductor line 210. The notch 220 may be formed by simply using the same mask for patterning the conductor line 210. That is, the edge of the selective metal line portion 230 is not a straight line but a notch shape. The notch 220 may be formed in a variety of possible shapes including regular polygons and irregular polygons. In the depicted embodiment, the shape of the notch 220 substantially resembles a trapezoid.

In the depicted embodiment, the extra mechanical stress components 250 include the tensile mechanical stress component 252 in the Y direction and the compressive stress component 254 in the X direction. The magnitude of the extra mechanical stress components 250 is related to an angle alpha (α) 260 and an area associated with the notch 220, which is defined in FIG. 2A by the area of the trapezoid. Further details of the effects of varying angle alpha 260 on the extra stress components 250 are shown in FIG. 2B.

Still referring to FIG. 2A, the magnitude of the extra mechanical stress components 250 gradually decreases at areas away from the notch 220. That is the magnitude of the extra stress components 250 is the strongest immediately surrounding the notch 220. The extra stress components 250 gradually decrease towards the center of the conductor line 210 and are even lower for areas located on the opposite edge of the conductor line 210. Additional details of the distribution characteristics of the extra stress components 250 generated within the conductor line 210 by the formation of notches having various sizes and shapes are shown in FIGS. 2C-2H.

Still referring to FIG. 2A, and as described earlier the conductor line 210, which is typically used to interconnect two or more components of an IC (not shown), has residual mechanical stresses (not shown) caused by residual thermal stresses (not shown) generated during the manufacturing process of the IC. The total, net or resultant mechanical stress effect within the conductor line 210 is a super-position of the extra mechanical stress components 250 generated by the notch 220 and the residual mechanical stresses which are normally present within the conductor line 210 before the formation of the notch 220. Further details of circuit layout techniques for forming one or more notches on the conductor line 210 to generate extra mechanical stress components 250 that substantially counteract the residual mechanical stresses are shown in FIG. 3.

Figure 2B:
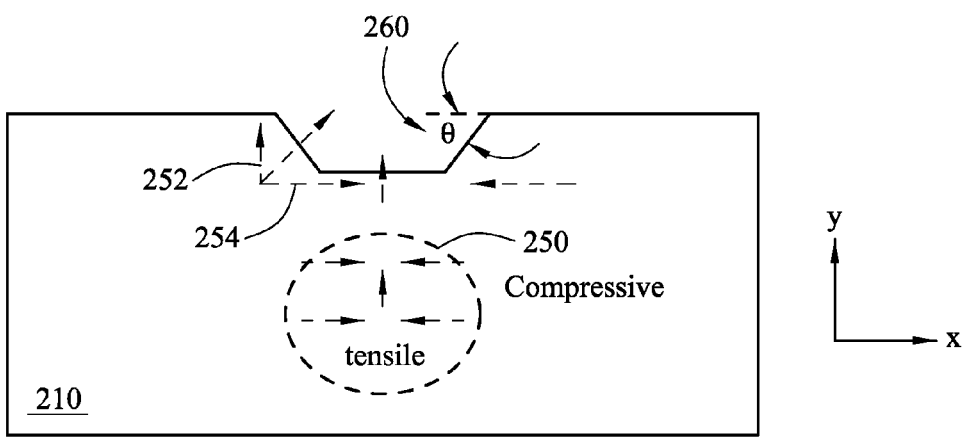
FIG. 2B is a schematic diagram to illustrate effects of varying angle alpha of FIG. 2A on the extra mechanical stress components, according to an embodiment.

FIG. 2B is a schematic diagram to illustrate effects of varying angle alpha of FIG. 2A on the extra mechanical stress components, according to an embodiment. In the depicted embodiment, when the angle alpha 260 is greater than 45 degrees then the ratio of the extra compressive component 254 in the X direction to the extra tensile component 252 in the Y direction is greater than one at any point adjacent to the notch 220. That is, the extra mechanical stress components 250 are largely compressive when the angle alpha 260 is greater than 45 degrees. Conversely, when the angle alpha 260 is less than 45 degrees then the ratio of the extra compressive component 254 in the X direction to the extra tensile component 252 in the Y direction is less than one at any point adjacent to the notch 220. That is, the extra mechanical stress components 250 are largely tensile when the angle alpha 260 is less than 45 degrees.

Figure 2C:
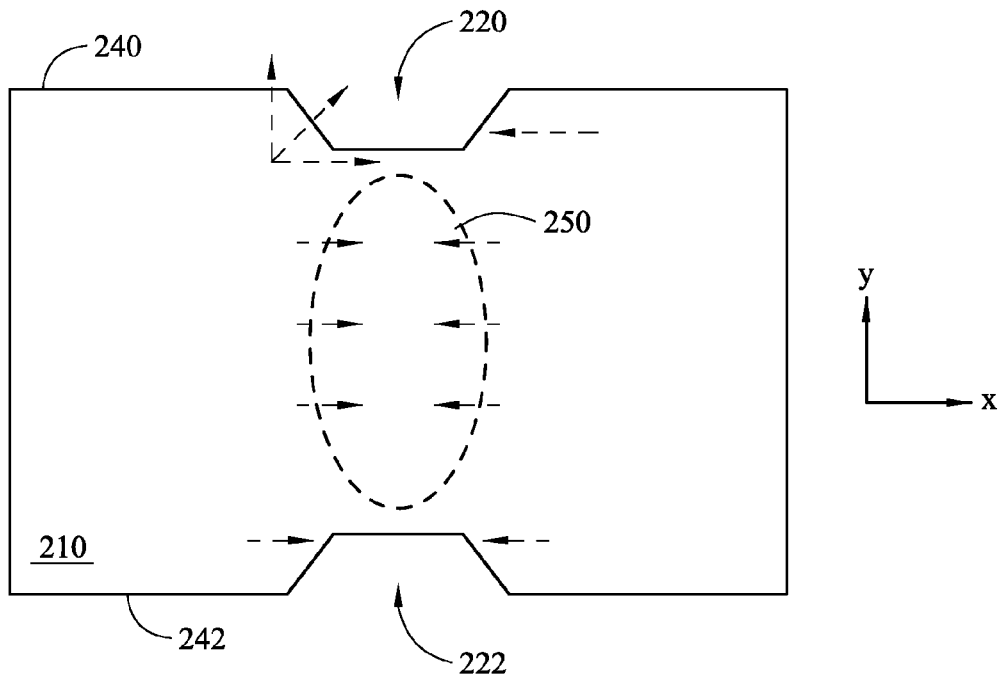
FIGS. 2C-2H are illustrative schematic diagrams for generating extra mechanical stress components by forming various notches in a conductor line, according to an embodiment.

FIGS. 2C-2H are illustrative schematic diagrams for generating extra mechanical stress components by forming various notches in a conductor line, according to an embodiment. Referring to FIG. 2C, two substantially similar notches 220 and 222 in the shape of a trapezoid are symmetrically formed on opposite edges 240 and 242 respectively of the conductor line 210. In the depicted embodiment, the formation of symmetrically placed notches 220 and 222 generate extra mechanical stress components 250, which are more symmetric and uniformly distributed in the center zone of the conductor line 210.

Figure 2D:
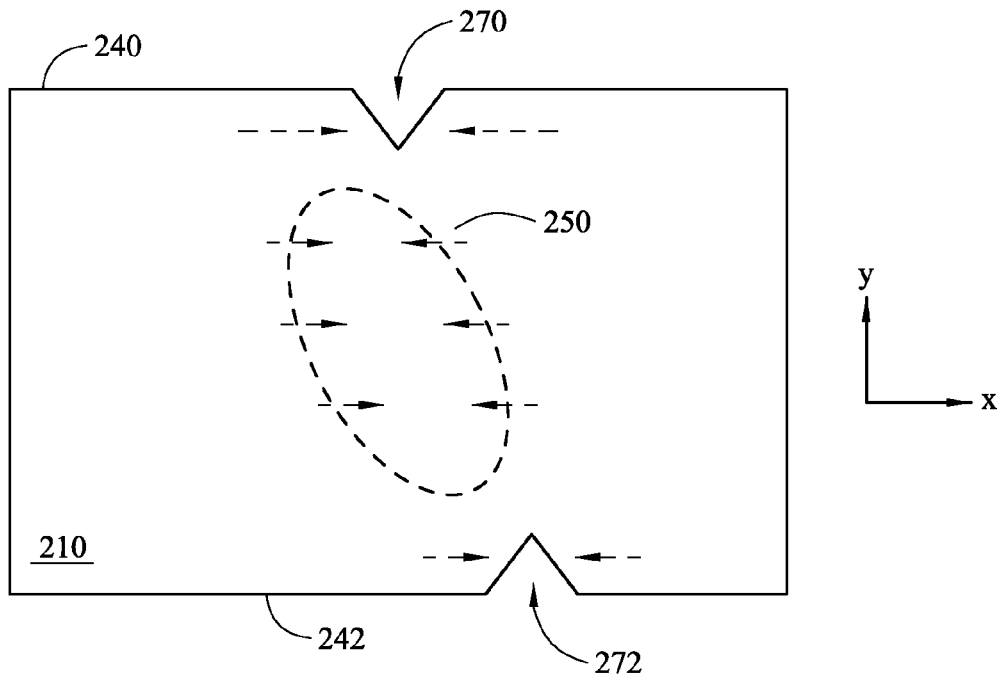

Referring to FIG. 2D, two substantially similar notches 270 and 272 in the shape of a triangle are asymmetrically formed on opposite edges 240 and 242 respectively of the conductor line 210, according to an embodiment. In the depicted embodiment, the formation of asymmetrically placed notches 270 and 272 generate extra mechanical stress components 250, which are more asymmetrically distributed in the center zone of the conductor line 210 but uniformly distributed along a center line joining the two notches 270 and 272.

Figure 2E:
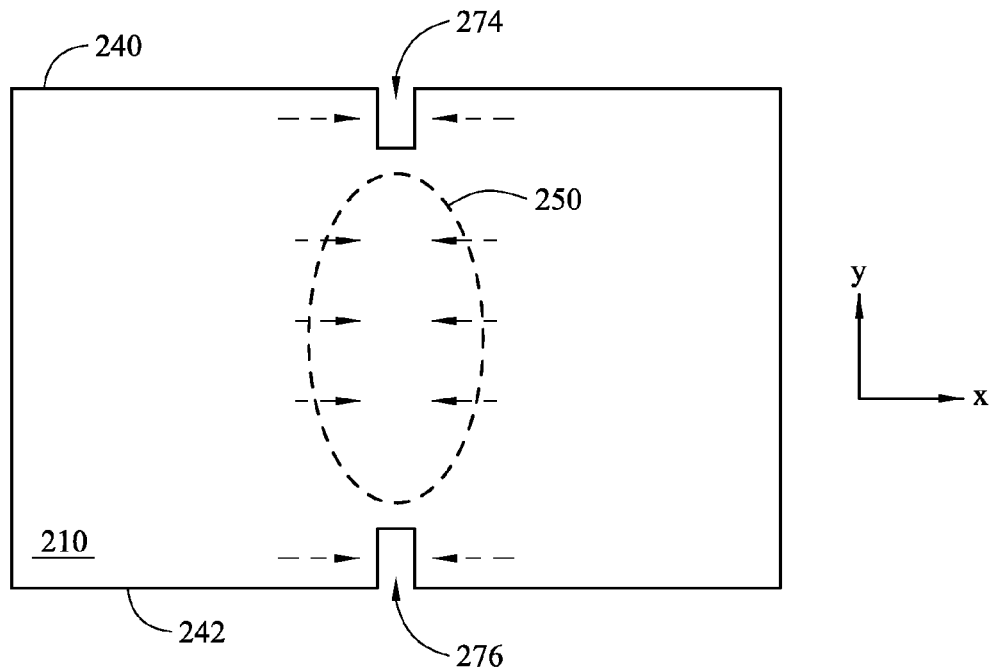

Referring to FIG. 2E, two substantially similar notches 274 and 276 in the shape of a rectangle are symmetrically formed on opposite edges 240 and 242 respectively of the conductor line 210, according to an embodiment. In the depicted embodiment, the formation of symmetrically placed notches 274 and 276 generate extra mechanical stress components 250, which are more symmetrically and uniformly distributed in the center zone of the conductor line 210.

Figure 2F:
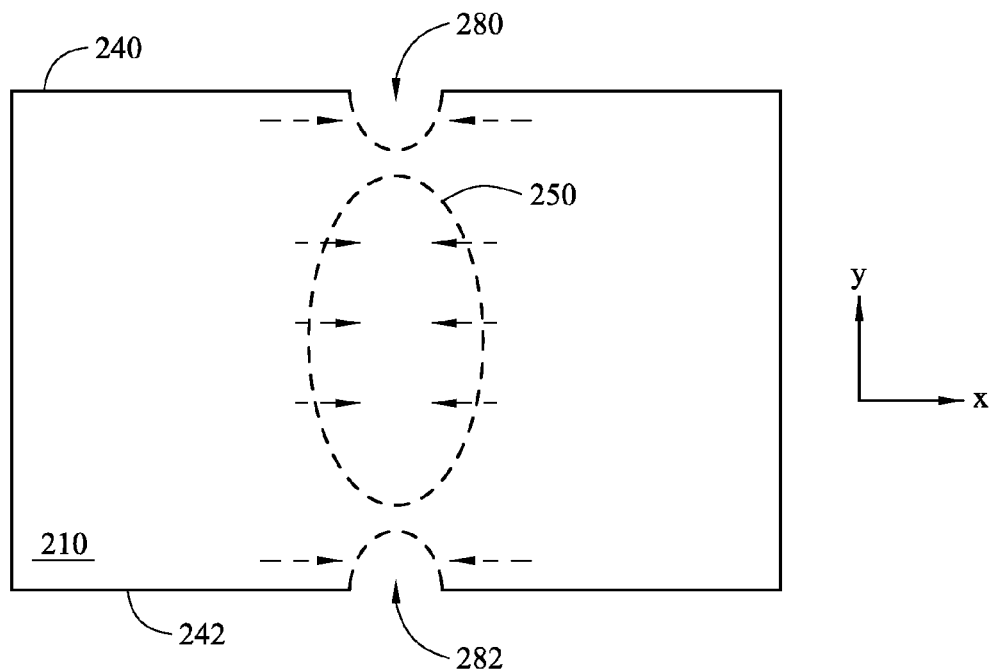

Referring to FIG. 2F, two substantially similar notches 280 and 282 in the shape of an arc are symmetrically formed on opposite edges 240 and 242 respectively of the conductor line 210, according to an embodiment. In the depicted embodiment, the formation of symmetrically placed notches 280 and 282 generate extra mechanical stress components 250, which are more symmetrically and uniformly distributed in the center zone of the conductor line 210.

Figure 2G:
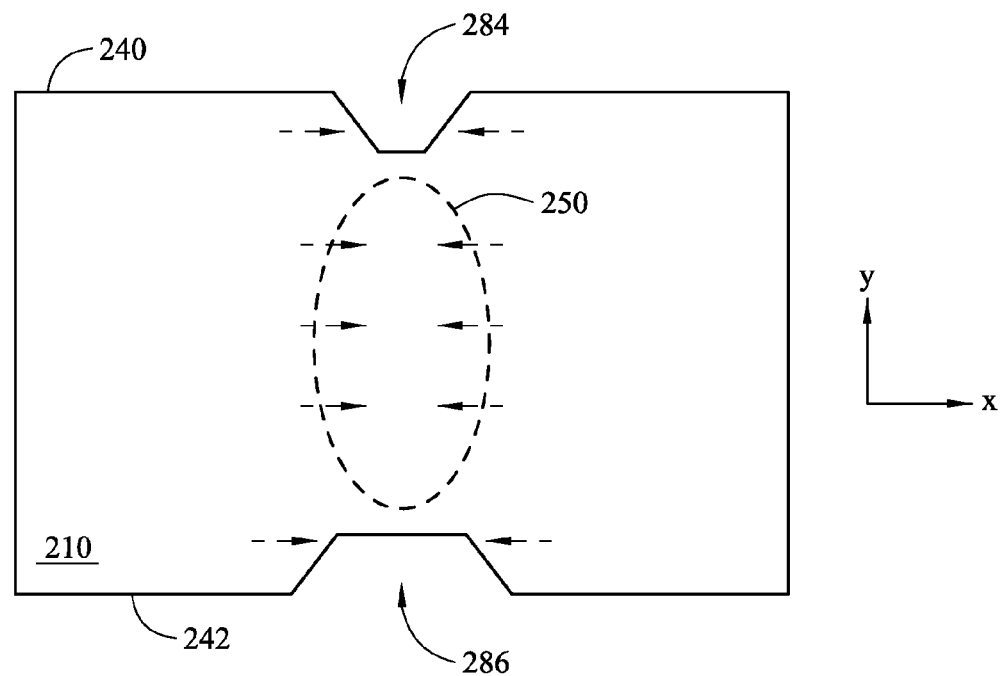

Referring to FIG. 2G, two notches 284 and 286 both in the shape of a trapezoid but having dissimilar sizes are symmetrically formed on opposite edges 240 and 242 respectively of the conductor line 210, according to an embodiment. In the depicted embodiment, the formation of dissimilar sized notches 270 and 272 generate extra mechanical stress components 250, which are more asymmetrical along a center line joining the two notches 284 and 286.

Figure 2H:
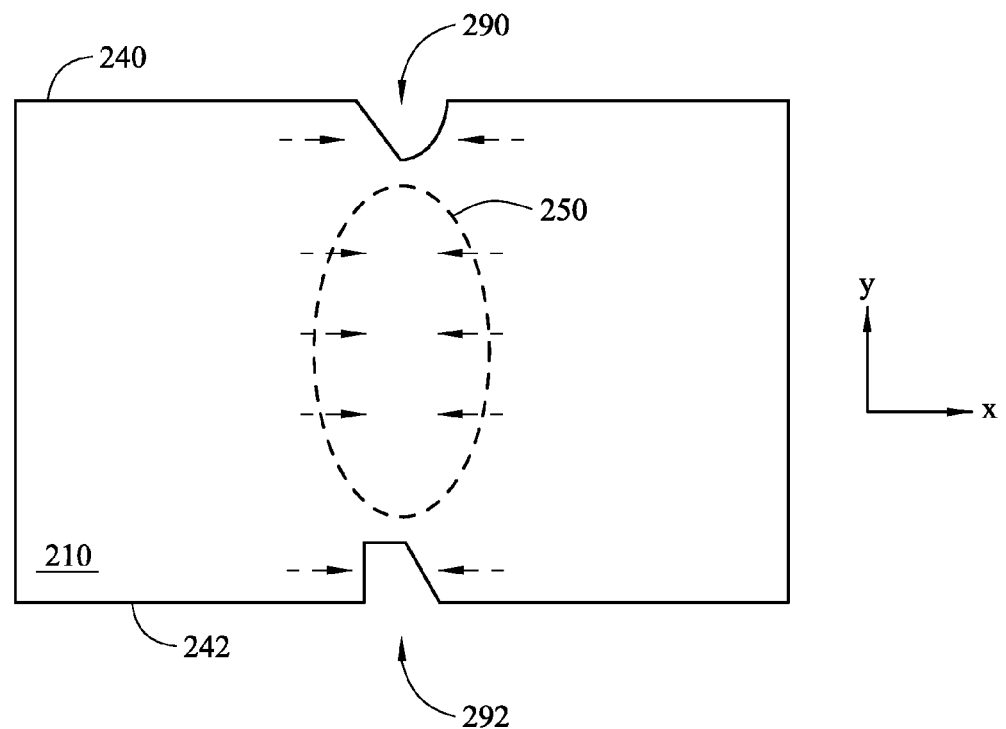

Referring to FIG. 2H, two dissimilar notches 290 and 292 in the shape of an arc and a trapezoid respectively are symmetrically formed on opposite edges 240 and 242 respectively of the conductor line 210, according to an embodiment. In the depicted embodiment, the formation of dissimilar shaped notches 270 and 272 generate extra mechanical stress components 250, which are more asymmetrical along a center line joining the two notches 290 and 292.

Other variations in the size and shape of the notch 220 are contemplated. It will be apparent to those of skill in the art that numerous changes may be made in such details without departing from the spirit and scope of the present invention.

FIGS. 3A1 and 3A2 illustrative schematic diagrams for optimally positioning one or more notches of FIGS. 2A-2H to reduce mechanical stress induced voiding (SIV) in metal interconnects, according to an embodiment. As described earlier, void formation 160 (generally associated with tensile stresses in metal line) is related to the movement of metal atoms (e.g., copper atoms) away from via in a multi-layer circuit. Referring to FIG. 3A1, in a multi-layer semiconductor device (not shown), the conductor line 210 is under residual tensile mechanical stress and includes via 240 to interconnect to another layer (not shown) in the device. Presence of residual mechanical tensile stress is related to the movement of copper atoms away from via 240. In one embodiment, via 240 is same as via 130. In order to suppress movement of copper atoms away from via 240, extra mechanical stress components 250 are generated or introduced around the via 240 position within the conductor line 210 that substantially counteract the residual tensile mechanical stresses. That is, notches 320 and 330 are optimally positioned or formed on edges 322 and 332 of the conductor line 210 thereby generating extra mechanical stress components 250 that are biaxial and substantially counteract the residual mechanical stresses. Selecting the angle alpha 260, which is greater than 45 degrees for each of the notches 320 and 330, generates extra bi-axial compressive stresses around via 240. The extra stress components 250 thus suppress or substantially reduce the movement of copper atoms away from via 240. In one embodiment, extra mechanical stress components 250 are generated to suppress accumulation (or hillock growth) (not shown) that is generally associated with compressive residual mechanical stresses. The extra stress components 250 generated by the notching thus advantageously reduce the residual stress without having to add extra steps to the manufacturing process.

Referring to FIG. 3A2, optimal positioning of three notches to reduce mechanical stress induced voiding (SIV) in metal interconnects is illustrated, according to an embodiment. In the depicted embodiment, three notches 390, 392 and 394 are formed to generate extra stress components 250 around the two vias 310 and 311. In one embodiment, vias 310 and 311 are same as vias 130 and 140.

Figure 3B:
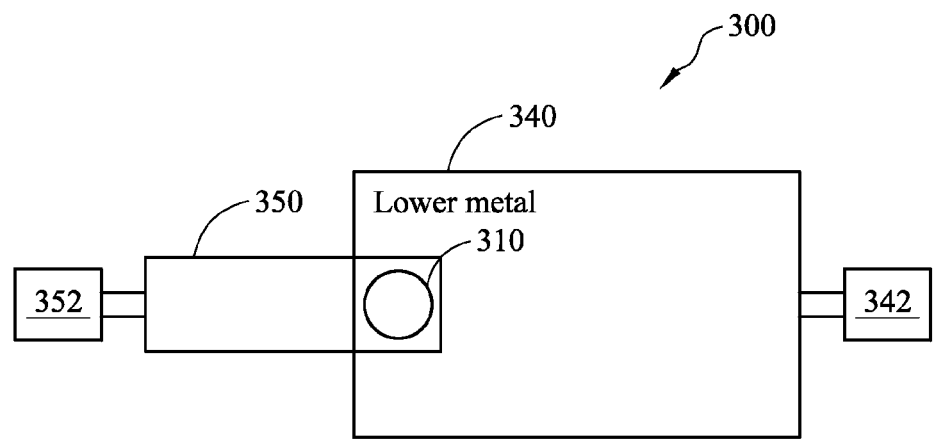
FIGS. 3B, 3C and 3D are illustrative schematic diagrams of a multilayer semiconductor device having mechanical stress induced void formation prior to generating extra mechanical stress components.
Figure 3C:
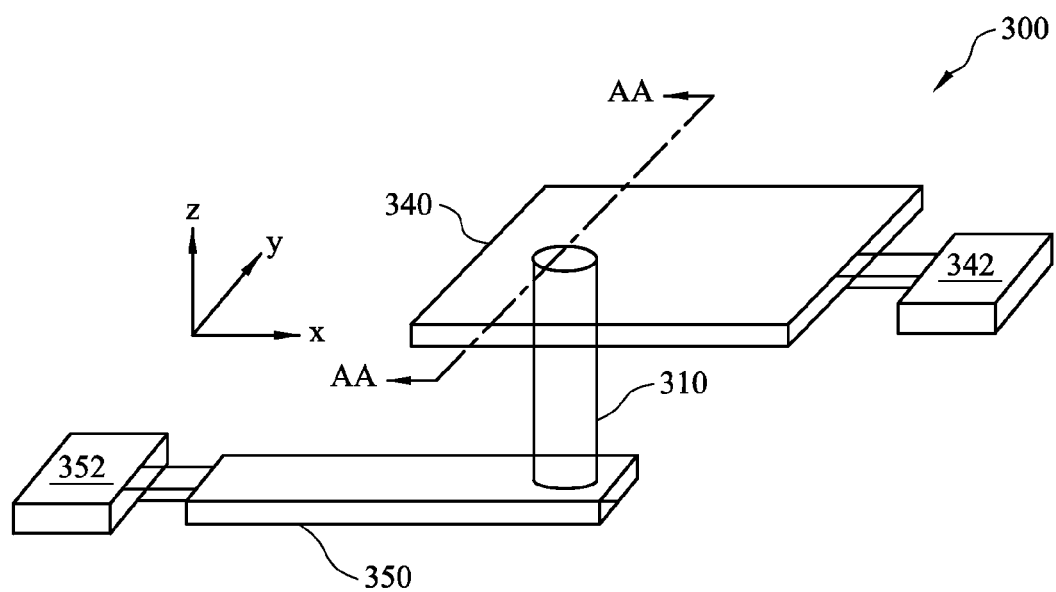
Figure 3D:
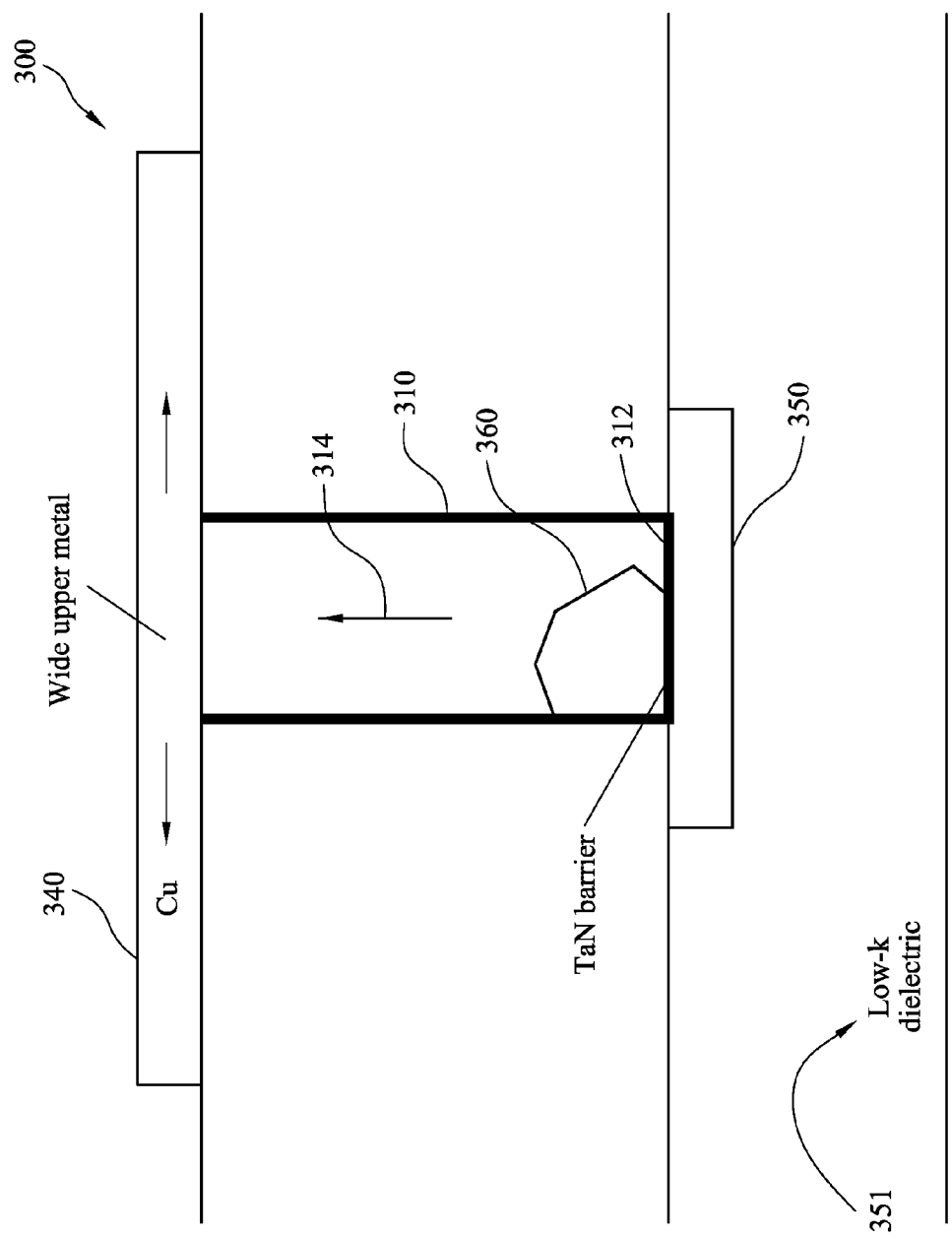
Figure 3E:
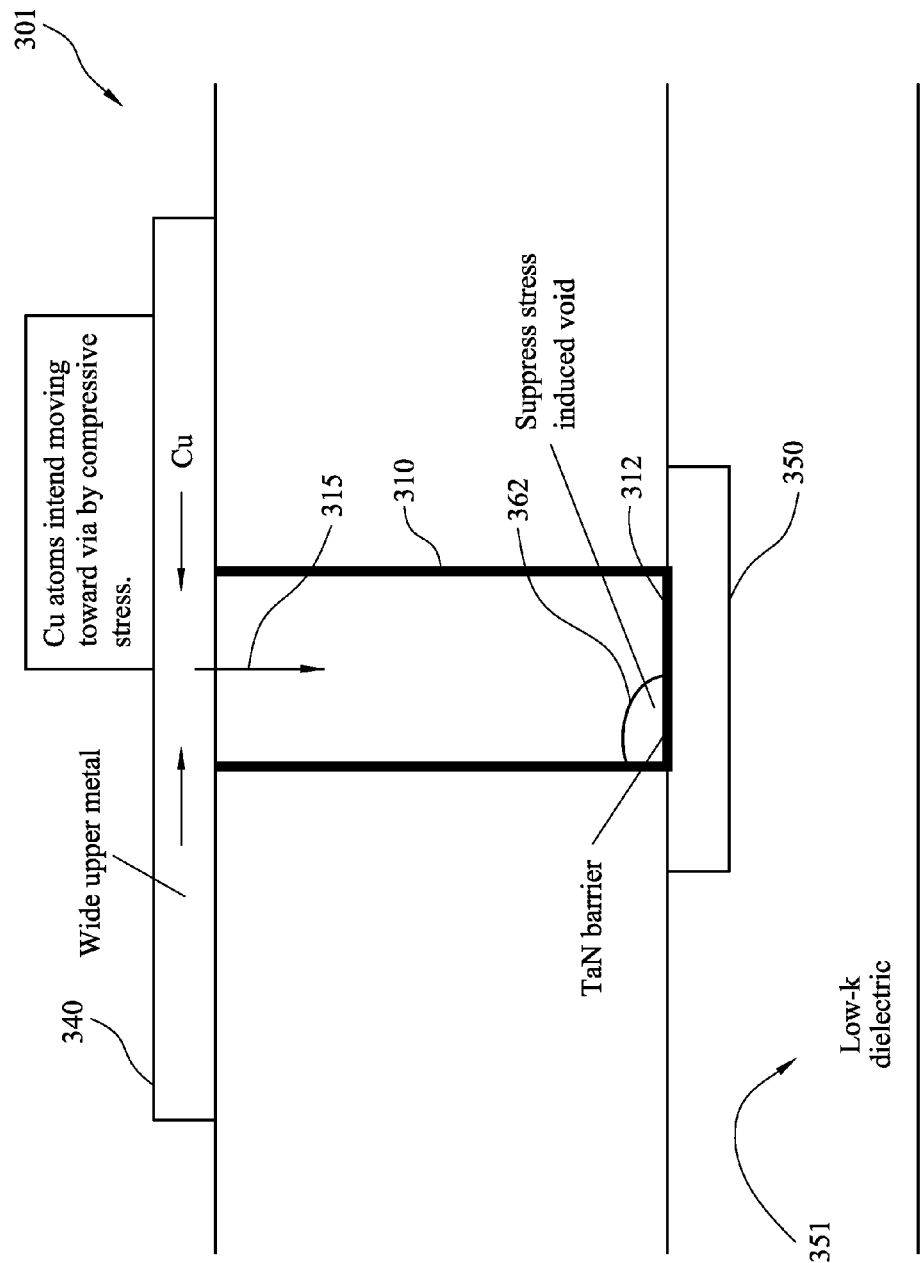
FIG. 3E is an exemplary cross-sectional view similar to view section AA-AA of FIG. 3d of a multi-layer semiconductor device with reduced mechanical stress induced void formation, according to an embodiment.
Figure 3F:
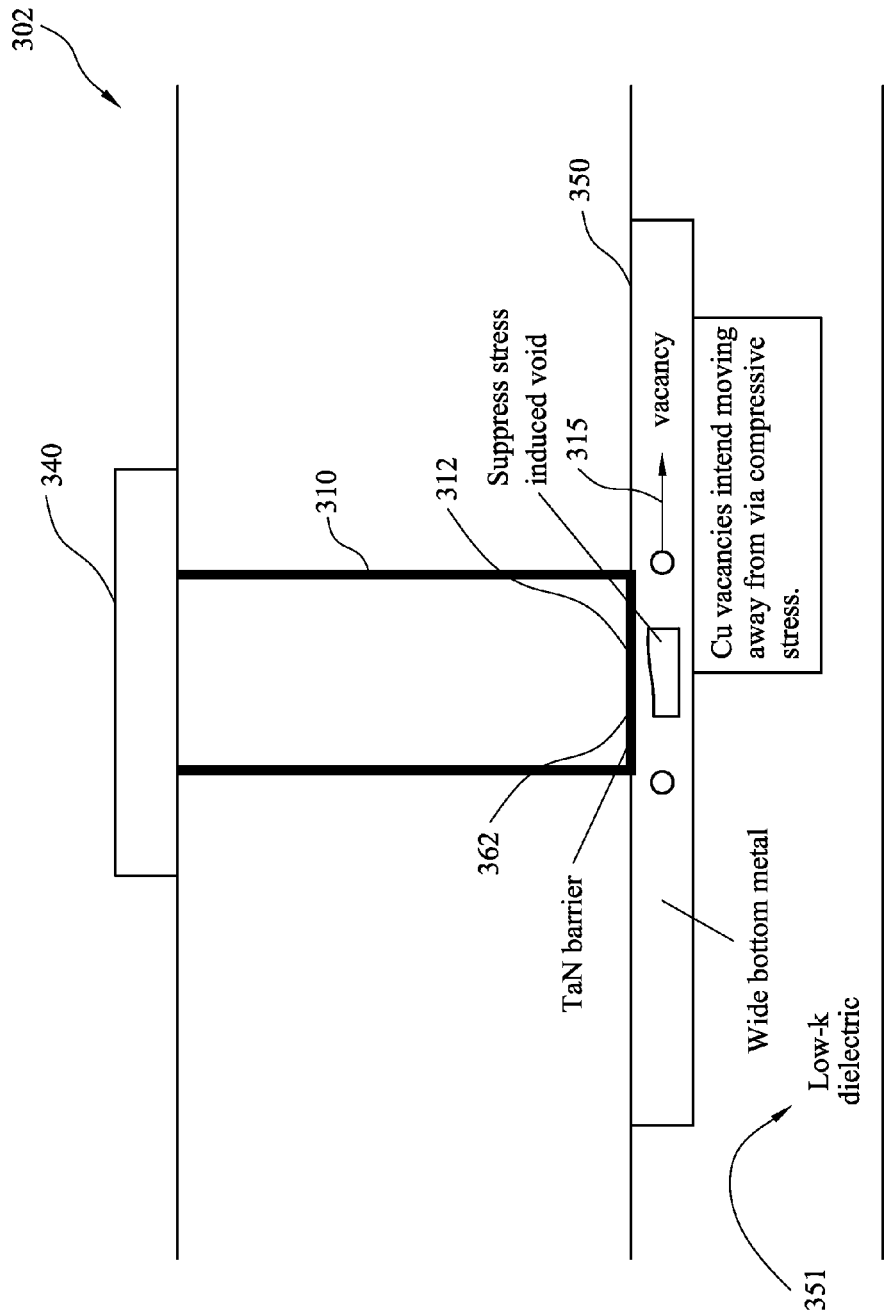
FIG. 3F is an exemplary cross-sectional view (similar to view section AA-AA of FIG. 3d) of a multi-layer semiconductor device with reduced stress induced void formation, according to an embodiment.

FIGS. 3B, 3C and 3D illustrate schematic diagrams of a multi-layer semiconductor device having mechanical stress induced void formation prior to generating extra mechanical stress components and FIGS. 3E and 3F illustrate exemplary cross-sectional views of a multi-layer semiconductor device with reduced mechanical stress induced void formation after generating extra mechanical stress components, according to an embodiment. Referring to FIG. 3B, a top view of a multi-layer semiconductor device 300 is shown, according to an embodiment included in the device 300 is an upper metal line 340 connected to a lower metal line 350 by via 310. The upper metal line 340 is wider in comparison to the lower metal line 350. In one embodiment, the upper metal line 340 is connected to component 342 included in the device 300 and the lower metal line 350 is connected to component 352 also included in the device 300. Examples of venous components such as 342 and 352 interconnected by conductors within an IC may include transistors, diodes, resistors, capacitors, contact terminals and the like.

Referring to FIG. 3C, an isometric view of the multi-layer semiconductor device 300 is shown, according to an embodiment. The upper metal line 340 connected to the lower metal line 350 by via 310. The upper metal line 340 is wider in comparison to the lower metal line 350. In one embodiment, the upper metal line 340 is connected to component 342 included in the device 300 and the lower metal line 350 is connected to component 352 also included in the device 300.

Referring to FIG. 3D, a cross-sectional view AA-AA of the multi-layer semiconductor device 300 of FIG. 3C is shown, according to an embodiment. In the depicted embodiment, via 310 is insulated by a thin barrier metal layer (e.g. Tantalum nitride (TaN)) 312. The mechanical stress induced void formation 360, which is substantially same as the void 160, is formed by the migrating of copper atoms away from via 310. That is, in direction 314 toward the upper wider metal line 340. The lower metal line 350 is insulated by a low k dielectric 351.

Referring to FIG. 3E, an exemplary cross-sectional view (similar to view AA-AA of FIG. 3D) of a multi-layer semiconductor device 301 with reduced stress induced void formation after generating extra mechanical stress components is shown, according to an embodiment. In the depicted embodiment, via 310 is insulated by the TaN barrier 312. In this embodiment, forming notches (not shown) in the upper metal line 340 (similar to the notches 320 and 330 illustrated in FIG. 3A) generates extra compressive stress components 360. The direction of the extra compressive stress components 315 is substantially opposite to that of the residual mechanical stress e.g., in direction 314 toward the upper metal line 340 of FIG. 3D, thereby suppressing the size of a stress induced void formation 362. The stress induced void formation 362 is reduced in comparison to the stress induced void formation 360 of FIG. 3D. In the depicted embodiment, the lower metal line 350 is insulated by the low k dielectric 351.

Referring to FIG. 3F, an exemplary cross-sectional view similar to view AA-AA of FIG. 3D of a multi-layer semiconductor device 302 with reduced stress induced void formation after generating extra mechanical stress components is shown, according to an embodiment. In the depicted embodiment, the lower metal line 350 is wider than the upper metal line 340, and coupled by via 310. The via 310 is insulated by the TaN barrier 312. In this embodiment, forming notches (not shown) in the lower metal line 350 similar to the notches 320 and 330 illustrated in FIG. 3A generates extra compressive stress components. The direction 315 of the extra compressive stress components 250 is substantially opposite to that of the residual stress (caused by copper vacancies moving toward via 310 bottom), thereby suppressing the size of the reduced stress induced void formation 362. The stress induced void formation 362 is thus reduced in comparison to the stress induced void formation 360 of FIG. 3D. The lower metal line 350 is insulated by a low k dielectric 351. The extra stress components 250 generated by notching technique thus advantageously reduce the residual mechanical stress without having to add extra steps to the manufacturing process.

Figure 4:
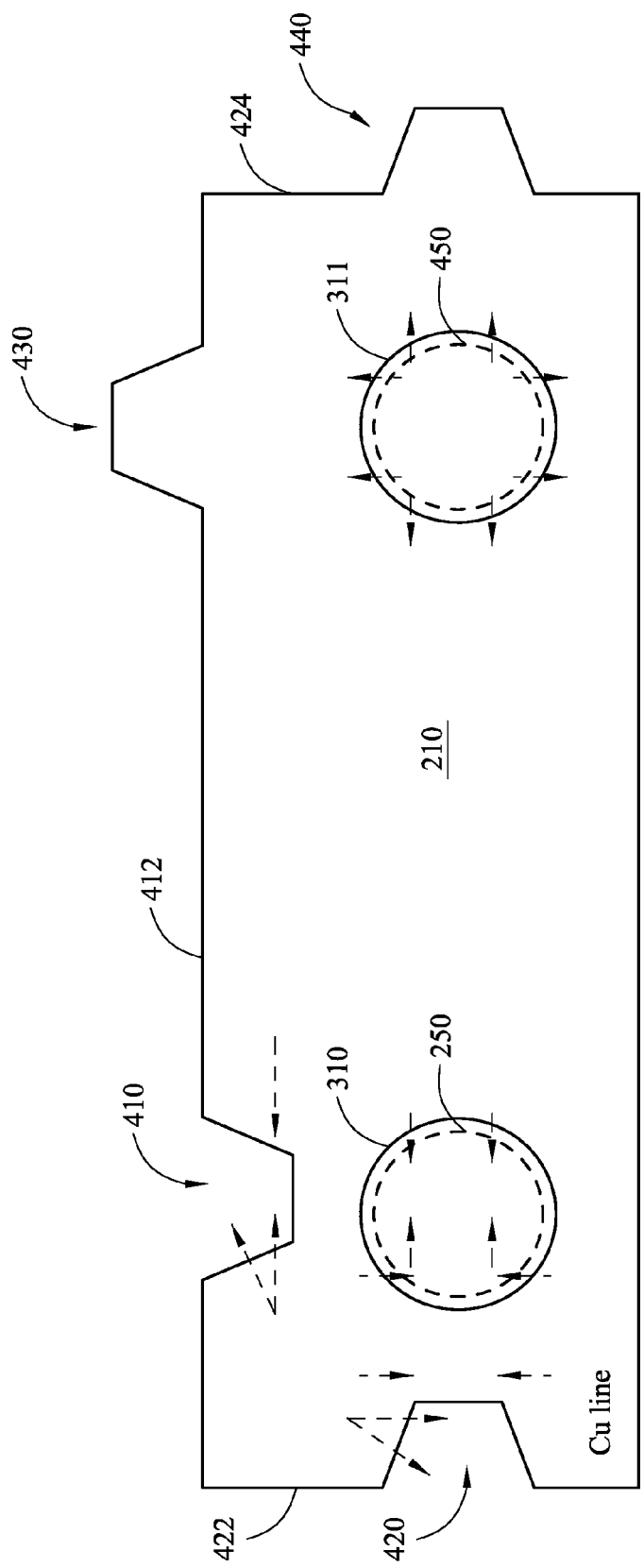
FIG. 4 illustrates forming notches of various shapes to reduce mechanical stress induced voiding (SIV) in metal interconnects, according to an embodiment.

Referring to FIG. 4, forming notches of various shapes to reduce mechanical stress induced voiding (SIV) in metal interconnects is illustrated, according to an embodiment. Layout techniques for the formation of one or more notches may be applied on narrow conductor line 210 carrying a high current density at the cathode and anode sides. Inward notches 410 and 420, similar to the notches 220 and 222, are formed on adjacent edges 412 and 422 of the conductor line 210. The conductor line 210 is connected to other components by vias 310 and 311. In the depicted embodiment, formation of inwardly notching notches 410 and 420 generate extra mechanical stress components 250, which are more symmetric and uniformly distributed around the via 310. Thus, inward notching on cathode side generates the extra mechanical stress components 250, which are compressive. The compressive extra stress components 250 generated, thereby, suppress copper atom movement away from via 310 (by electron flow). Similarly, outward notches 430 and 440 are formed on adjacent edges 412 and 424 of the conductor line 210. In the depicted embodiment, formation of outwardly notching notches 430 and 440 on anode side generate tensile extra stress components 450, which are more symmetric and uniformly distributed around the via 311. Thus, the tensile extra stress components 450 suppress metal atom accumulation at anode area. That is, these components 450 suppress copper atom moving forward toward via 311 (by electron flow).

Figure 5:
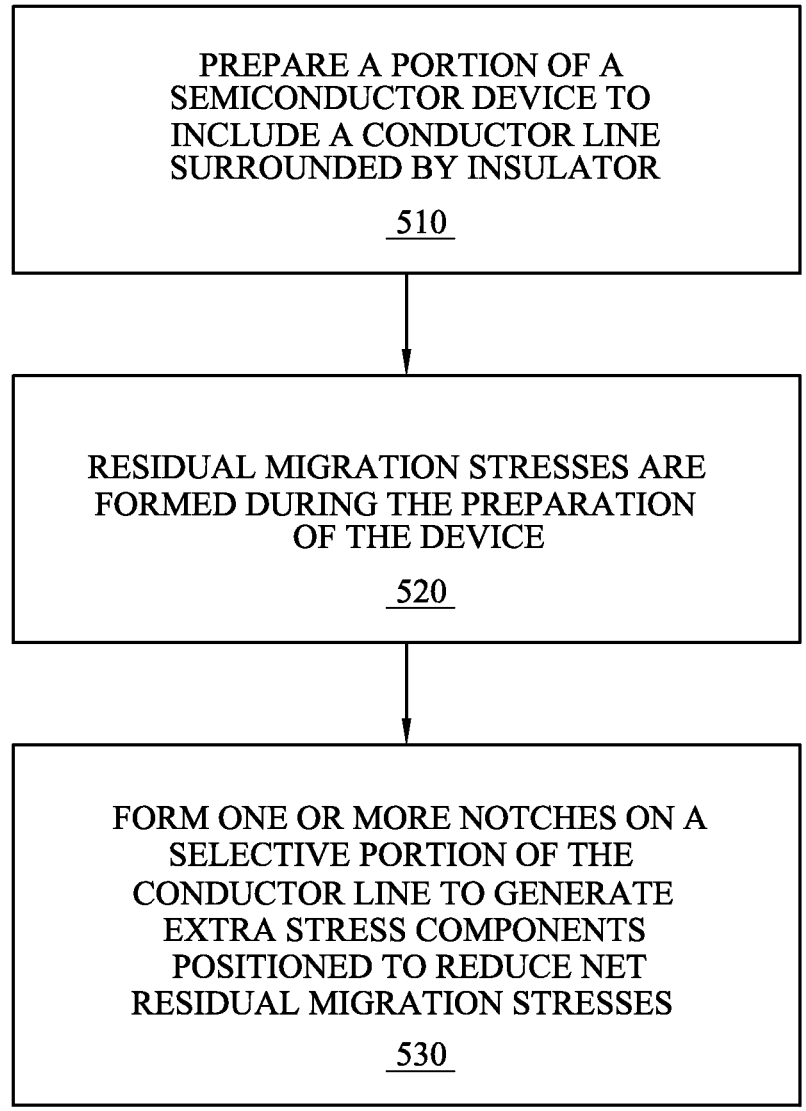
FIG. 5 is a flow chart illustrating a method for reducing failures in a semiconductor circuit, according to an embodiment.

FIG. 5 is a flow chart illustrating a method for reducing failures in a semiconductor circuit, according to an embodiment. In step 510, a notch shape is placed in a layout of a selective portion of a metal line mask for patterning a plurality of conductor lines included in the circuit. In step 520, a portion of the circuit is fabricated to include the conductor line 210 having the notch shape. The conductor line 210 is surrounded by an insulator material interconnects at least two components of the circuit. The fabrication of this portion results in formation of residual stresses within the conductor line 210 and the surrounding insulator material. In step 530, remaining portions of the circuit are fabricated to complete the circuit. The notch shape generates extra stress components within the conductor line 210 compared to forming the conductor line 210 without the notch shape. The extra stress components substantially counteract the residual stresses, thereby causing a net reduction in the residual stresses.

The description of the present embodiments have been presented for purposes of illustration, but are not intended to be exhaustive or to limit the invention to the forms disclosed. Many additional aspects, modifications and variations are also contemplated and are intended to be encompassed within the scope of the following claims. For example, the layout techniques are applicable to reduce residual stress as commonly encountered in modern copper interconnect and low k dielectric. If residual stress in copper line is compressive (e.g., due to new low k dielectric materials with larger thermal expansion coefficients than copper or due to thermal treatment of copper) then the polarity of notching of the above layout techniques needs to be reversed. That is, outward notching for extra compressive components and inward notching for extra tensile components. As another example, notches may be formed within a wide metal line in addition to the edges of the conductor line for generating extra bi-axial compressive components around via areas. While certain aspects of the present invention have been described in the context of a copper line, those of ordinary skill in the art will appreciate that the processes of the present invention are capable of being applied to any metal lines in a variety of forms.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A semiconductor device comprising: at least two components;
    a conductor line connecting said at least two components, said conductor line including parallel edges;
    insulator materials substantially surrounding said conductor line; and an inward extending notch disposed on a first edge of said parallel edges and extending inwardly from said first edge at a first lengthwise location along a length of said conductor line, and an outward extending notch disposed on said first edge and extending outwardly from said first edge at a second lengthwise location along said conductor line and spaced from said first lengthwise location,
    wherein said conductor line is coupled to a via at said first lengthwise location and said via is spaced from said inward extending notch, and a second edge of said parallel edges is a continuous straight line extending from said first lengthwise location to said second lengthwise location,
    wherein said via is disposed completely between said inward extending notch and said second edge at said first lengthwise location, and further comprising a further via disposed between said outward extending notch and said second edge at said second lengthwise location.

2. The semiconductor device as in claim 1, wherein said inward extending notch and said outward extending notch each have a polygon shape, said inward extending notch having at least one edge forming an acute angle with said first edge.

3. The semiconductor device as in claim 1, wherein said inward extending notch includes an edge that intersects said first edge at an angle less than about 135°.

4. The semiconductor device as in claim 1, wherein said inward extending notch has an arc shape.

5. The semiconductor device as in claim 1, wherein said conductor line is further coupled to a further via at said second lengthwise location.

6. The semiconductor device as in claim 1, wherein said inward extending notch includes one straight edge and one curved edge.

7. The semiconductor device as in claim 1, further comprising a further via coupled to said conductor line adjacent to said outward extending notch.

8. The semiconductor device as in claim 1, wherein said inward extending notch and said outward extending notch have different sizes.

9. A semiconductor device comprising:
    at least two components;
    a conductor line connecting said at least two components and including parallel edges;
    insulator material substantially surrounding said conductor line;
    an inward extending notch disposed on a first edge of said parallel edges and extending inwardly from said first edge at a first lengthwise location along a length of said conductor line and an outward extending notch disposed on said first edge and extending outwardly from said first edge at a second lengthwise location along said conductor line and spaced from said first lengthwise location, and at least one further notch disposed on an adjacent non-parallel edge of said conductor line; and
    a first via disposed inwardly adjacent to said inward extending notch at said first lengthwise location and a second via disposed inwardly adjacent said outward extending notch at said second lengthwise location,
    wherein a second parallel edge of said conductor line is a substantially straight line that extends continuously between said first and second lengthwise locations.

10. The semiconductor device as in claim 9, wherein said at least one further notch includes a second inward extending notch disposed on a second edge of said parallel edges of said conductor line and adjacent to said first inward extending notch.

11. The semiconductor device as in claim 10, wherein said inward extending notch and said second inward extending notch have different sizes.

12. The semiconductor device as in claim 9, wherein said inward extending notch and said outward extending notch have different geometrical shapes and at least one of said inward extending notch and said outward extending notch has an arc shape.

13. The semiconductor device as in claim 9, wherein said inward extending notch and said outward extending notch each include a polygon shape, said inward extending notch including an edge that intersects said first edge at an angle less than about 135°.

* * * * *